(12) United States Patent
Nishimiya et al.

(10) Patent No.: US 8,753,239 B2
(45) Date of Patent: Jun. 17, 2014

(54) POWER TRANSMISSION DEVICE

(75) Inventors: Kazuhiko Nishimiya, Minato-ku (JP); Hideki Miura, Minato-ku (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 176 days.

(21) Appl. No.: 13/140,704

(22) PCT Filed: Dec. 19, 2008

(86) PCT No.: PCT/JP2008/073201
§ 371 (c)(1), (2), (4) Date: Jun. 17, 2011

(87) PCT Pub. No.: WO2010/070764
PCT Pub. Date: Jun. 24, 2010

(65) Prior Publication Data
US 2011/0251003 A1 Oct. 13, 2011

(51) Int. Cl.
*F16H 57/02* (2012.01)
*G21F 3/00* (2006.01)
*F16H 7/02* (2006.01)

(52) U.S. Cl.
USPC ............................................. 474/144

(58) Field of Classification Search
USPC ............................................. 474/144
See application file for complete search history.

(56) References Cited

U.S. PATENT DOCUMENTS

| | | | | |
|---|---|---|---|---|
| 1,948,010 A | * | 2/1934 | Shippy et al. | 83/62 |
| 2,529,301 A | * | 11/1950 | Lykken | 425/29 |
| 4,749,625 A | * | 6/1988 | Obayashi et al. | 428/624 |
| 4,749,895 A | | 6/1988 | Ruelle | |
| 5,211,992 A | | 5/1993 | Newton et al. | |
| 5,325,248 A | * | 6/1994 | Tabuchi et al. | 360/84 |
| 6,597,255 B1 | | 7/2003 | Turton | |
| 2002/0164458 A1 | * | 11/2002 | Suga et al. | 428/195 |
| 2003/0073533 A1 | * | 4/2003 | Knutson | 474/263 |

FOREIGN PATENT DOCUMENTS

| | | |
|---|---|---|
| EP | 0 263 010 A1 | 4/1988 |
| GB | 2 119 458 A | 11/1983 |
| JP | 58-162351 U | 10/1983 |
| JP | 63 170648 | 11/1988 |

(Continued)

OTHER PUBLICATIONS

U.S. Appl. No. 13/129,285, filed May 13, 2011, Ohtsuka, et al.

(Continued)

*Primary Examiner* — William E Dondero
*Assistant Examiner* — Mark K Buse
(74) *Attorney, Agent, or Firm* — Oblon, Spivak, McClelland, Maier & Neustadt, L.L.P.

(57) ABSTRACT

A power transmission device includes an electromagnetic wave-shielding wall partitioning a first space and a second space adjacent to the first space and blocking propagation of an electromagnetic wave between the first space and the second space. The power transmission device also includes a first pulley arranged within the first space and a second pulley arranged within the second space. The power transmission device also includes a belt placed on the first pulley and the second pulley and extending through the electromagnetic wave-shielding wall to transmit rotational driving force between the first space and the second space. From the electromagnetic wave-shielding wall a hollow tubular member is protruded and allows the first space and the second space to communicate with each other. The belt extends through the inside of the tubular member.

8 Claims, 4 Drawing Sheets

(56) References Cited

FOREIGN PATENT DOCUMENTS

| JP | 4-32351 U | 3/1992 |
| JP | 4 219170 | 8/1992 |
| JP | 8 326340 | 12/1996 |
| JP | 2007 120678 | 5/2007 |
| JP | 2008 261545 | 10/2008 |

OTHER PUBLICATIONS

Office Action issued Nov. 20, 2012 in Japanese Application No. 2010-542798 (With English Translation).

International Search Report Issued Jan. 20, 2009 in PCT/JP08/073201 filed Dec. 19, 2008.

Combined Chinese Office Action and Search Report issued May 23, 2013, in Chinese Patent Application No. 200880132261.1 with English translation and with English translation of category of cited documents.

Wu Ke Jian, et al., "Mechanical Design", Higher Education Publisher, Beijing, Jan. 2003, 1 front page, pp. 244-246.

Extended European Search Report issued Feb. 28, 2012, in European Patent Application No. 08878932.6.

* cited by examiner

POWER TRANSMISSION DEVICE

TECHNICAL FIELD

The present invention relates to a power transmission device, and particularly to a power transmission device which penetrates through a shield wall for blocking the propagation of an electromagnetic wave, to transmit rotational driving force.

BACKGROUND ART

Conventionally, it has been a common practice to form an electromagnetic wave-shielded room for the purpose of shielding an externally intruding unnecessary electromagnetic wave and preventing leakage of an internally generated electromagnetic wave to the outside. An electromagnetic wave-shielded room is formed with an intended section being surrounded with a plate member of a conductive material and the plate member being grounded. When power is to be transmitted from one to the other of the inside and the outside of an electromagnetic wave-shielded room, a through hole is formed in a plate member for blocking the propagation of an electromagnetic wave, and a power transmission device penetrating through the through hole is provided, thereby allowing power to be transmitted through the plate member forming the electromagnetic wave-shielded room.

When an electromagnetic wave-shielded room is provided with a power transmission device in the above manner, in the event of leakage of a radio wave by way of the through hole or leakage of a radio wave transmitted through the shaft, the shielding performance against an electromagnetic wave would be degraded. In particular, the higher frequency an electromagnetic wave has, the more likely the electromagnetic wave is to be transmitted by way of the surface of the shaft due to the skin effect. In order to achieve improved shielding performance against an electromagnetic wave of a high frequency, it is necessary to block an electromagnetic wave leaking through the shaft surface. To that end, a technology has been proposed in which a through hole formed in a plate member of a conductive material is penetrated thorough by a sleeve made of metal so that leakage of an electromagnetic wave by way of the through hole is suppressed, and in which a direct-coupling shaft of an insulating material is inserted into the sleeve so that leakage of an electromagnetic wave by way of the shaft is also suppressed (for example, see Japanese Patent Laying-Open No. 8-326340 (Patent Document 1)).

Patent Document 1: Japanese Patent Laying-Open No. 8-326340

DISCLOSURE OF THE INVENTION

Problems to be Solved by the Invention

In the technology as proposed in Patent Document 1, it is necessary to collinearly align a motor, a generator, and a direct-coupling shaft which directly couples the motor and the generator. This causes a problem that since a power transmission device has a longer total length from the generator to the motor, the device has little flexibility in arrangement and may be difficult to lay out. In contrast, with a configuration in which rotational driving force is transmitted by a pair of pulleys and a belt placed on the pulleys, a free layout and easy arrangement of the power transmission device can be achieved.

There is, however, a problem that in order to transmit rotational driving force through a shield wall for blocking the propagation of an electromagnetic wave, it is necessary to form, in the shield wall, a hole through which a belt can extend and that an electromagnetic wave leaks by way of this hole.

The present invention has been made in view of the problems above, and a main object of the invention is to provide a power transmission device which penetrates through a shield wall for blocking the propagation of an electromagnetic wave, to transmit rotational driving force and in which leakage of an electromagnetic wave can be effectively suppressed.

Means for Solving the Problems

The power transmission device according to the present invention includes an electromagnetic wave-shielding wall, a first pulley, a second pulley, and a belt. The electromagnetic wave-shielding wall partitions a first space and a second space adjacent to the first space and blocks the propagation of an electromagnetic wave between the first space and the second space. The first pulley is arranged within the first space. The second pulley is arranged within the second space. The belt is placed on the first pulley and the second pulley and extends through the electromagnetic wave-shielding wall to transmit rotational driving force between the first space and the second space. From the electromagnetic wave-shielding wall a hollow tubular member is protruded and allows the first space and the second space to communicate with each other. The belt extends through the inside of the tubular member.

In the above-described power transmission device, preferably, the first pulley and the second pulley are V-pulleys, and the belt is a V-belt.

In the above-described power transmission device, preferably, in the first pulley and the second pulley, a plurality of pulley grooves are circumferentially formed and on the first pulley and the second pulley, a plurality of the belts are placed. From the electromagnetic wave-shielding wall a first tubular member and a second tubular member are protruded. The belt includes a first belt group extending through the inside of the first tubular member and a second belt group extending through the inside of the second tubular member.

In the above-described power transmission device, preferably, the first pulley and the second pulley are toothed pulleys, and the belt is a toothed belt.

Preferably, the above-described power transmission device further includes a grounding member. The grounding member is formed of a conductive material. The grounding member grounds at least any one of the first pulley and the second pulley.

Effects of the Invention

According to the power transmission device of the present invention, a tubular member protruded from an electromagnetic wave-shielding wall is formed in a manner to have a sufficiently long length relative to the dimension of its inner diameter, thereby to suppress leakage of an electromagnetic wave by way of the inside of the tubular member. In order to transmit rotational driving force between a first space and a second space using a belt, it is necessary to drill a through hole in the electromagnetic wave-shielding wall at a position to serve as a path for the belt; nevertheless, by arranging the belt inside the tubular member to allow the belt to extend through the electromagnetic wave-shielding wall, leakage of an electromagnetic wave by way of the path for the belt from the first space to the second space (or from second space to the first space) can be suppressed.

DESCRIPTION OF THE REFERENCE SIGNS

Figure 1:
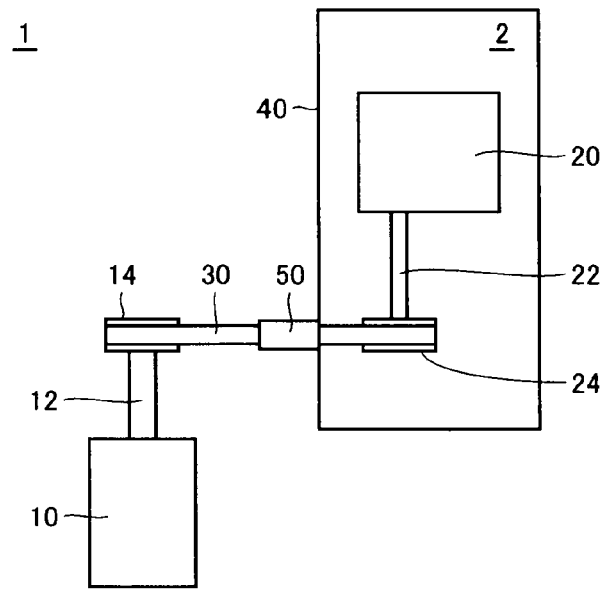
FIG. 1 is a plan schematic view illustrating the configuration of a power transmission device according to a first embodiment of the present invention.

1 first space, 2 second space, 10 driver, 12, 22 shaft part, 14, 16 first pulley, 20 driven part, 24, 26, 28 second pulley, 29 pulley groove, 30, 36, 38 belt, 38a first belt group, 38b second belt group, 40 electromagnetic wave-shielding wall, 41 attachment/detachment part, 50, 56, 58a, 58b tubular member, 51, 57 through hole, 56a, 56b wall member, 60 earthing brush.

BEST MODES FOR CARRYING OUT THE INVENTION

Embodiments of the present invention will be described hereinafter with reference to the drawings. In the drawings below, the same or corresponding elements have the same reference numerals allotted, and description thereof will not be repeated.

In the embodiments described hereinafter, each component is not necessarily indispensable in the present invention unless otherwise specified. In addition, in the embodiments below, reference to the number, an amount or the like is merely by way of example unless otherwise specified, and the scope of the present invention is not necessarily limited to that number, that amount or the like.

First Embodiment

FIG. 1 is a plan schematic view illustrating the configuration of a power transmission device according to a first embodiment of the present invention. As shown in FIG. 1, the power transmission device is a device for transmitting rotational driving force between a first space 1 and a second space 2 which is surrounded by an electromagnetic wave-shielding wall 40. Second space 2 is a section enclosed by electromagnetic wave-shielding wall 40. Electromagnetic wave shielding-wall 40 is formed of a combination of plate members of a conductive material, and blocks the propagation of an electromagnetic wave between first space 1 and second space 2. Electromagnetic wave-shielding wall 40 constitutes an outer wall of second space 2 as an electromagnetic wave-shielded room. Second space 2 is a space adjacent to first space 1 which is an external space of electromagnetic wave-shielding wall 40, and partitioned from first space 1 by electromagnetic wave-shielding wall 40.

Within first space 1, a driver 10, such as a motor, is arranged. Within second space 2, a driven part 20, such as a fan, is arranged. The power transmission device of the present embodiment transmits rotational driving force from driver 10 to driven part 20. It is noted that driver 10 serving as a drive source may be arranged within second space 2 surrounded by electromagnetic wave-shielding wall 40, with driven part 20 being arranged within first space 1.

Rotational driving force generated at driver 10 is transmitted to a first pulley 14 by way of a shaft part 12. First pulley 14 is arranged within first space 1 and formed to be rotatable together with shaft part 12. First pulley 14 is cylindrically formed and has an outer circumference on which a belt 30 is placed. The power transmission device of the first embodiment is a belt power transmission device which transmits rotational driving force via belt 30.

Belt 30 is also placed on an outer circumference of a cylindrical second pulley 24. Belt 30 extends through electromagnetic wave-shielding wall 40 to transmit rotational driving force between first pulley 14 arranged within first space 1 and second pulley 24 arranged within second space 2. That is, when rotational driving force transmitted from driver 10 to first pulley 14 causes first pulley 14 to rotate, the rotation of first pulley 14 is transmitted to second pulley 24 by way of belt 30 and causes second pulley 24 to rotate. A shaft part 22 which is integrally rotatably attached to the center of second pulley 24, rotates together with rotation of second pulley 24 and causes driven part 20 to rotate.

On electromagnetic wave-shielding wall 40, a tubular member 50 is provided in a manner to protrude into the first space 1 side. Belt 30 is arranged to extend through the inside of tubular member 50 across both of first space 1 and second space 2.

Figure 2:
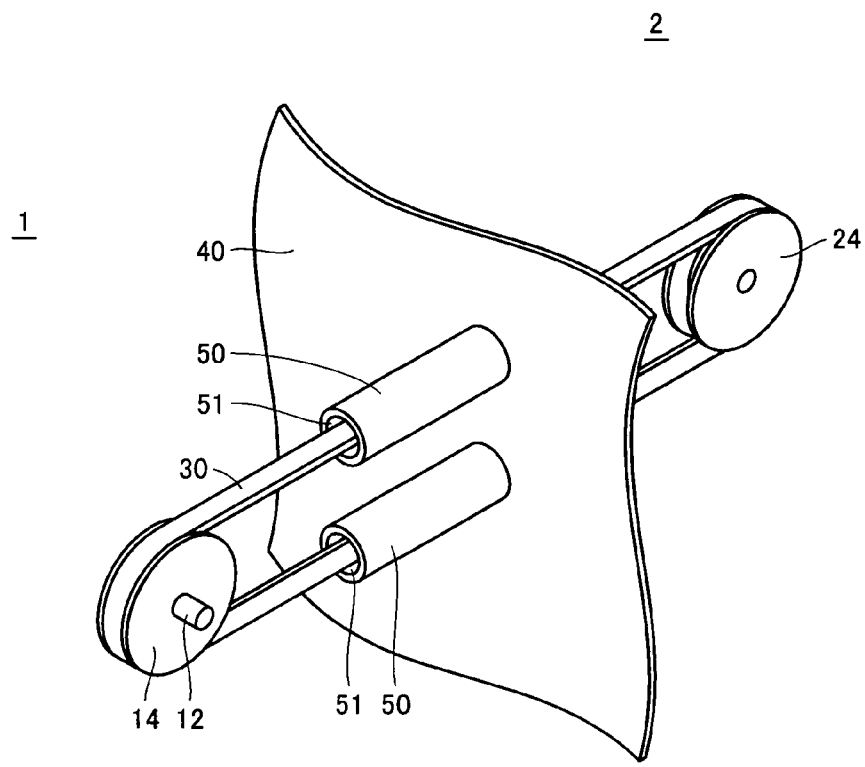
FIG. 2 is a perspective view illustrating a structure in which a belt extends through an electromagnetic wave-shielding wall by way of the inside of a tubular member.

FIG. 2 is a perspective view illustrating a structure in which belt 30 extends through electromagnetic wave-shielding wall 40 by way of the inside of tubular member 50. Belt 30 of the first embodiment is a V-belt having a V-shaped cross section, and first pulley 14 and second pulley 24 on which belt 30 is placed are V-pulleys each having an outer circumferential surface on which a V-shaped pulley groove corresponding to the V-belt is formed in the circumferential direction. In the power transmission device of the first embodiment using a V-belt, when tension acts on belt 30, belt 30 engages in pulley grooves of first pulley 14 and second pulley 24 and generates strong frictional force, which allows thin belt 30 to transmit relatively large rotational driving force. Further, quiet operation can be achieved even at a high rotation rate.

As shown in FIG. 2, tubular member 50 is formed to be hollow. Formed inside tubular member 50 is a through hole 51 extending through tubular member 50 in the longitudinal direction. Through hole 51 is formed in tubular member 50 and a through hole which is not shown in the drawing is drilled in electromagnetic wave-shielding wall 40 at a position corresponding to a base portion of tubular member 50. Consequently, first space 1 and second space 2 communicate with each other via the inner space of tubular member 50.

Belt 30 is arranged to extend through through hole 51 inside tubular member 50 and the through hole formed in electromagnetic wave-shielding wall 40. At the inside of first space 1, a portion of belt 30 is placed on first pulley 14, and at the inside of second space 2, another portion of belt 30 is placed on second pulley 24. Belt 30 transmits rotational driving force generated at driver 10 between first space 1 and second space 2.

Belt 30 is formed of an insulating material such as a rubber material and a resin material represented by polyurethane. Thus, occurrence of leakage of an electromagnetic wave propagated by way of belt 30, from one to the other of first space 1 and second space 2 is suppressed.

Further, through hole 51 is formed in tubular member 50 in a manner to extend sufficiently long relative to its diameter (for example, in a manner to allow tubular member 50 having a cylindrical shape to have an axial length of more than five times the diameter of through hole 51). Thus, for example, an electromagnetic wave propagated from the first space 1 side into through hole 51 is sharply attenuated within through hole 51. The strength of an electromagnetic wave transmitting through through hole 51 and propagated to the second space 2 side is extremely low as compared with the strength of the electromagnetic wave just before propagating into through hole 51. That is, leakage of an electromagnetic wave from first space 1 to second space 2 by way of through hole 51 is suppressed.

In the power transmission device of the first embodiment, belt 30 is arranged within through hole 51 inside tubular member 50, and belt 30 extends through electromagnetic wave-shielding wall 40 by way of through hole 51. As such, leakage of an electromagnetic wave by way of a path of belt 30 from first space 1 to second space 2 (or from second space 2 to first space 1) can be suppressed. As a result, the inside of second space 2 can be maintained as a preferable space as a radio wave-shielded room which is electrically isolated so as to be unaffected by any electromagnetic wave from the outside.

Figure 3:
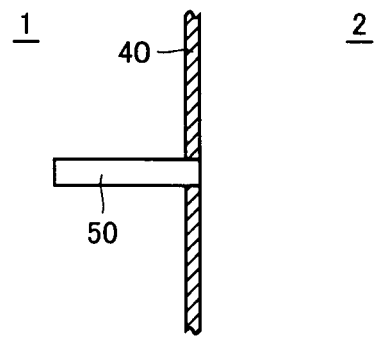
FIG. 3 is a partial cross-sectional view illustrating a first example of an arrangement of a tubular member relative to an electromagnetic wave-shielding wall.
Figure 4:
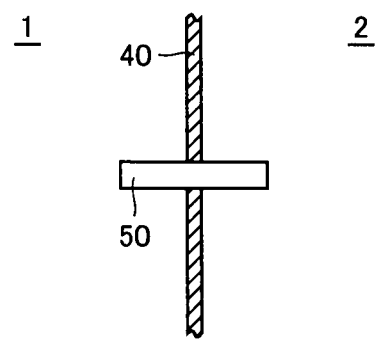
FIG. 4 is a partial cross-sectional view illustrating a second example of an arrangement of a tubular member relative to an electromagnetic wave-shielding wall.
Figure 5:
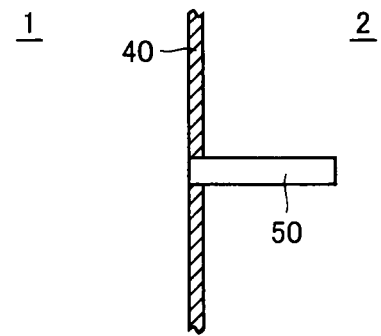
FIG. 5 is a partial cross-sectional view illustrating a third example of an arrangement of a tubular member relative to an electromagnetic wave-shielding wall.

FIGS. 3-5 are partial cross-sectional views illustrating examples of arrangement of tubular member 50 relative to electromagnetic wave-shielding wall 40. In the perspective view shown in FIG. 2, tubular member 50 is provided in a manner to protrude on the first space 1 side relative to electromagnetic wave-shielding wall 40, as shown in FIG. 3. This does not limit arrangement of tubular member 50 relative to electromagnetic wave-shielding wall 40, rather, tubular member 50 may be provided on any side relative to electromagnetic wave-shielding wall 40.

For example, as shown in FIG. 4, tubular member 50 may be formed to protrude on both of the first space 1 side and the second space 2 side relative to electromagnetic wave-shielding wall 40. Further, as shown in FIG. 5, tubular member 50 may be formed to protrude on the second space 2 side relative to electromagnetic wave-shielding wall 40.

Second Embodiment

Figure 6:
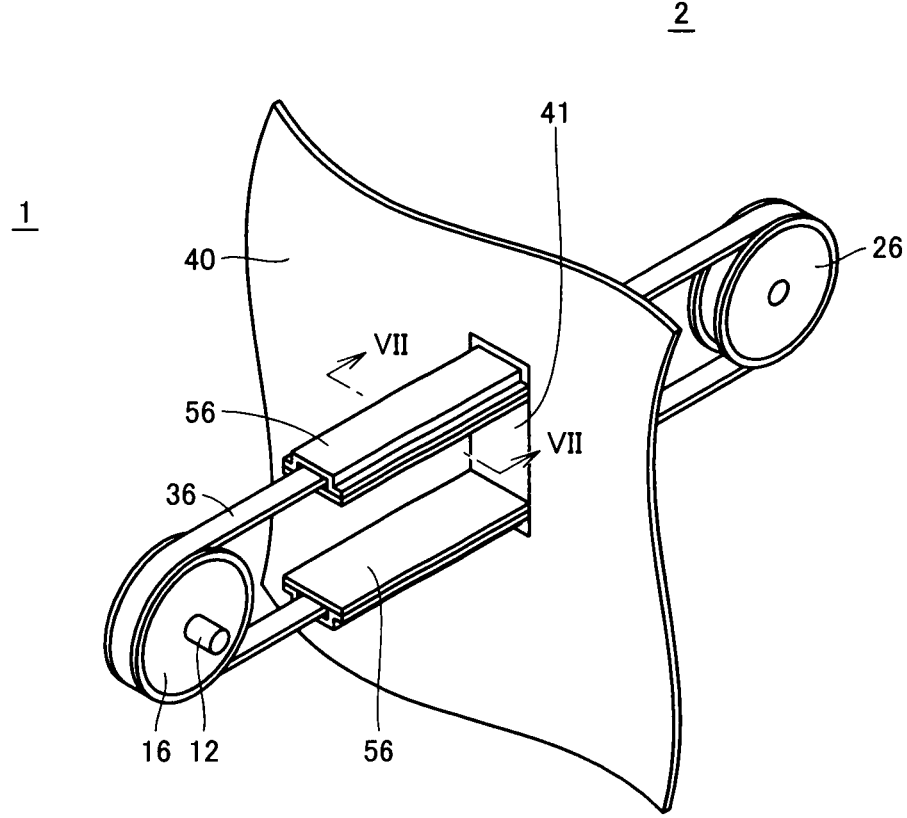
FIG. 6 is a perspective view illustrating a partial structure of a power transmission device according to a second embodiment.

FIG. 6 is a perspective view illustrating a partial structure of a power transmission device according to a second embodiment. FIG. 6 illustrates a structure in which a belt 36 placed on a first pulley 16 and a second pulley 26 of the second embodiment extends through electromagnetic wave-shielding wall 40 by way of the inside of a tubular member 56.

Belt 36 of the second embodiment 2 is a band-shaped toothed belt (cogged belt) having, throughout its length, one side provided with a tooth profile and the other side shaped to be flat. Each of first pulley 16 and second pulley 26 on which belt 36 is to be placed are toothed pulleys (cogged pulleys) each having an outer circumferential surface on which a tooth profile having a corresponding shape to the tooth profile of the toothed belt is formed in the circumferential direction. Typically, belt 36 may serve as a timing belt and first pulley 16 and second pulley 26 may serve as timing pulleys.

In the power transmission device of the second embodiment utilizing a toothed belt, engagement of the tooth profiles provided on belt 36 and first pulley 16 and second pulley 26 allows for transmission of rotation without slipping, in contrast to a V-belt which transmits power solely by friction only. This allows a rotational phase between two shafts to be accurately maintained. Further, the frictional loss is smaller as compared with that of a friction-dependent V-belt.

Belt 36 is formed of an insulating material such as a rubber material exemplified by chloroprene rubber and a resin material exemplified by polyurethane. Thus, occurrence of leakage of an electromagnetic wave propagated by way of belt 30, from one to the other of first space 1 and second space 2 is suppressed.

Figure 7:
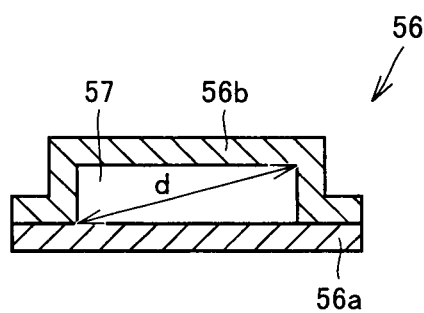
FIG. 7 is a cross-sectional view of a tubular member taken along line VII-VII shown in FIG. 6.

FIG. 7 is a cross-sectional view of tubular member 56 taken along line VII-VII shown in FIG. 6. In FIG. 7, belt 36 is not shown. As shown in FIG. 7, an outer wall of tubular member 56 is formed of a combination of two members, wall members 56a, 56b. Thus, tubular member 56 of any shape can be easily formed and tubular member 56 can be easily mounted.

Belt 36 of the second embodiment is a toothed belt formed into a band shape and has a rectangular cross-sectional shape. Thus, a through hole 57 formed at the inside of tubular member 56 is formed to have a rectangular cross-sectional shape corresponding to the cross sectional shape of belt 36, as shown in FIG. 7. The diagonal dimension of a rectangle forming the cross-sectional shape of through hole 57 (the dimension d shown in FIG. 7) is the diameter of the rectangle.

Through hole 57 through which belt 36 being an approximately band-shaped toothed belt extends, can have a smaller cross-sectional area as compared with the cross-sectional area of through hole 51 of the first embodiment through which a V-belt extends. Thus, a relatively large ratio of the length of tubular member 56 to diameter d of through hole 57 can be achieved. The larger the above-described length ratio is, the more an electromagnetic wave propagating through the inside of through hole 57 can be attenuated, and thus the more effectively leakage of an electromagnetic wave by way of through hole 57 can be suppressed.

As shown in FIG. 6, a portion of electromagnetic wave-shielding wall 40 is configured as a removable attachment/detachment part 41. Two tubular members 56 are fixed to attachment/detachment part 41. Attachment/detachment part 41 is formed such that belt 36 and second pulley 26 can pass through a hole formed by removal of attachment/detachment part 41. As such, by removing attachment/detachment part 41 from electromagnetic wave-shielding wall 40, belt 36 and second pulley 26 which is arranged within second space 2 being a sealed space can be easily moved to the first space 1 side. An operator can remove attachment/detachment part 41 from the first space 1 side to move first pulley 16 and second pulley 26 as well as belt 36 to the inside of first space 1 together with attachment/detachment part 41 and tubular member 56 and can easily perform maintenance of belt 36 or second pulley 26.

Third Embodiment

Figure 8:
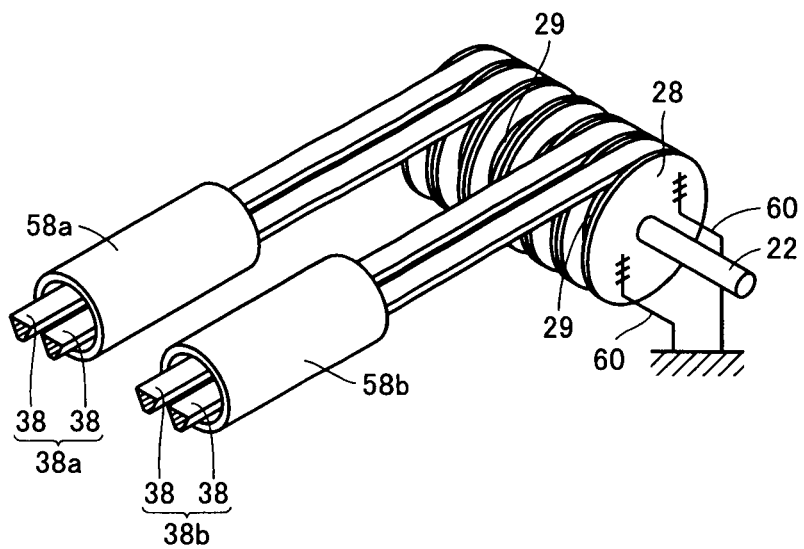
FIG. 8 is a perspective view illustrating a partial structure of a power transmission device according to a third embodiment.

FIG. 8 is a perspective view illustrating a partial structure of a power transmission device according to a third embodiment. FIG. 8 illustrates a second pulley 28 of the third embodiment, belts 38 (38a, 38b) placed on second pulley 28, and tubular members 58a, 58b through the inside of which belts 38 extend, while a first pulley and an electromagnetic wave-shielding wall are not shown in the drawing.

In second pulley 28, a plurality of (six in this case) pulley grooves 29 are circumferentially formed. In the first pulley that is not shown in FIG. 8, pulley grooves 29 of the same number as that of the second pulley 28 are also formed. On the above-described first pulley and second pulley 28, a plurality of (four in this case) belts 38 are placed to transmit rotational driving force from the first pulley to the second pulley 28. Belt 38 is a V-belt and the above-described first pulley and second pulley 28 are V-pulleys. In the power transmission device of the third embodiment, the number of belt 38 is more than one. Thus, the power transmission device of the third embodiment can transmit larger rotational driving force as compared with the power transmission device of the first embodiment.

Belt 38 includes a first belt group 38a extending through the inside of tubular member 58a and a second belt group 38b extending through the inside of tubular member 58b. Tubular member 58a serving as a first tubular member and tubular member 58b serving as a second tubular member are, as in the first and second embodiments, protruded from the electromagnetic wave-shielding wall which is not shown in the drawing.

Allowing all of the plurality of belts 38 to extend through the inside of a single tubular member would have a problem that in order to ensure sufficient shielding performance against an electromagnetic wave propagating within a through hole formed in the tubular member, it would be necessary to allow the tubular member to have a longer length, and in that case the device would have a larger size. In contrast, in the power transmission device of the third embodiment shown in FIG. 8, the electromagnetic wave-shielding wall is provided with a plurality of tubular members 58a, 58b, the plurality of belts 38 are divided into first belt group 38a and second belt group 38b, and first belt group 38a and second belt group 38b are allowed to extend through the inside of separate tubular members 58a, 58b, respectively.

As such, neither of tubular members 58a, 58b has to allow all of belts 38 to extend therethrough, and each of tubular members 58a, 58b can have relatively small diameter. Tubular members 58a, 58b with a small diameter needs a shorter length for ensuring shielding performance against an electromagnetic wave propagating through the inside thereof. That is, forming a plurality of tubular members 58a, 58b in parallel and allowing each of tubular members 58a, 58b to have a smaller hole diameter can shorten the necessary length of tubular members 58a, 58b. Therefore, the power transmission device using a plurality of belts 38 to transmit larger torque can be made smaller in size.

First belt group 38a includes two belts 38. Second belt group 38b also includes two belts 38. If a tubular member allowing all of four belts 38 to extend through the inside thereof were provided, the tubular member would have a larger inner diameter, which would result in degraded shielding performance. On the other hand, if four tubular members each allowing only one belt 38 to extend therethrough were provided, the number of holes to be formed in electromagnetic wave-shielding wall 40 would increase, which would result in degraded shielding performance. That is, it is considered that by dividing four belts 38 into first belt group 38a and second belt group 38b each including two belts 38, shielding performance against an electromagnetic wave can be optimized.

As shown in FIG. 8, in contact with a surface of second pulley 28, a plurality of earthing brushes 60 as an example of a grounding member are provided. Earthing brush 60 is formed of a conductive material and grounds second pulley 28. That is, earthing brush 60 connects second pulley 28 and a reference potential point such as the ground and equalizes the potentials of second pulley 28 and the reference potential point.

Belt 38, which is a V-belt, has a portion engaging in second pulley 28, and static electricity can be generated at this portion. If static electricity builds up to generate a spark, an electromagnetic wave would be generated within second space 2. Even when leakage of an electromagnetic wave from the outside into second space 2 surrounded by electromagnetic wave-shielding wall 40 is being suppressed, generation of an electromagnetic wave within second space 2 could have an adverse effect on an electrical component arranged within second space 2. Thus, by providing earthing brush 60 to ground second pulley 28, even if static electricity is generated at second pulley 28, such static electricity can be dissipated to the ground. Therefore, generation of a spark can be suppressed, and generation of an electromagnetic wave within second space 2 can be suppressed.

A plurality of earthing brushes 60 can be provided as shown in FIG. 8. As such, even when one of earthing brushes 60 is worn and no longer in contact with second pulley 28, another earthing brush 60 is in contact with second pulley 28 and it can be ensured that second pulley 28 is grounded to prevent a build up of static electricity.

Further, as to the first pulley not shown in FIG. 8, by providing earthing brush 60 in the same manner so as to ground the first pulley, a build up of static electricity in the first pulley can be suppressed and generation of a spark can be suppressed.

Although the embodiments of the present invention have been described as above, it should be construed that embodiments disclosed herein are by way of illustration in all respects, not by way of limitation. It is intended that the scope of the present invention is defined by claims, not by the above description, and includes all modifications equivalent in meaning and scope to the claims.

INDUSTRIAL APPLICABILITY

The present invention is advantageously applicable in particular to a power transmission device for transmitting rotating driving force using a belt extending through a wall part of a radio wave-shielded room, from the outside to the inside (or from the inside to the outside) of the radio wave-shielding room.

The invention claimed is:
1. A power transmission device, comprising:
an electromagnetic wave-shielding wall partitioning a first space and a second space adjacent to said first space and blocking propagation of an electromagnetic wave between said first space and said second space;
a first pulley arranged within said first space;
a second pulley arranged within said second space;
a belt placed on said first pulley and said second pulley and extending through said electromagnetic wave-shielding wall to transmit rotational driving force between said first space and said second space; and
a removable part, said removable part being arranged in a hole in a portion of said electromagnetic wave-shielding wall, said belt extending through said hole, and said hole being of a size corresponding to a size of said second pulley to allow said second pulley and said belt to pass through the hole when the removable part is removed, from said electromagnetic wave-shielding wall a hollow tubular member being protruded and allowing said first space and said second space to communicate with each other, wherein said belt extends through an inside of said tubular member, and said tubular member is fixed to said removable part.

2. The power transmission device according to claim 1, wherein said first pulley and said second pulley are V-pulleys, and said belt is a V-belt.

3. The power transmission device according to claim 2, wherein in said first pulley and said second pulley, a plurality of pulley grooves are circumferentially formed and on said first pulley and said second pulley, a plurality of said belts are placed, from said electromagnetic wave-shielding wall a first tubular member and a second tubular member are protruded, and said belt includes a first belt group extending through an inside of said first tubular member and a second belt group extending through an inside of said second tubular member.

4. The power transmission device according to claim 1, wherein said first pulley and said second pulley are toothed pulleys, and said belt is a toothed belt.

5. The power transmission device according to claim 1, further comprising a grounding member formed of a conductive material and grounding at least any one of said first pulley and said second pulley.

6. The power transmission device according to claim 1, wherein an axial length of said tubular member is five times the diameter of the inside of said tubular member.

7. The power transmission device according to claim 1, wherein said tubular member protrudes from said electromagnetic wave-shielding wall into both said second space and said first space.

8. The power transmission device according to claim 1, wherein an entirety of said electromagnetic wave-shielding wall and an entirety of said removable part are arranged between said first pulley, which is arranged within said first space, and said second pulley, which is arranged within said second space.

* * * * *